United States Patent
Ku et al.

(10) Patent No.: US 9,506,144 B2
(45) Date of Patent: Nov. 29, 2016

(54) METHOD FOR ATOMIC LAYER DEPOSITION

(75) Inventors: Ching-Shun Ku, Kaohsiung (TW); Hsin-Yi Lee, Hsinchu County (TW)

(73) Assignee: National Synchrotron Radiation Research Center, Hsin-Chu (TW)

( * ) Notice: Subject to any disclaimer, the term of this patent is extended or adjusted under 35 U.S.C. 154(b) by 0 days.

(21) Appl. No.: 13/487,702

(22) Filed: Jun. 4, 2012

(65) Prior Publication Data

US 2013/0209685 A1 Aug. 15, 2013

(30) Foreign Application Priority Data

Feb. 10, 2012 (TW) .............................. 101104333 A

(51) Int. Cl.
*C23C 16/00* (2006.01)
*C23C 16/40* (2006.01)
*C23C 16/455* (2006.01)

(52) U.S. Cl.
CPC ....... *C23C 16/407* (2013.01); *C23C 16/45531* (2013.01); *C23C 16/45525* (2013.01); *C23C 16/45527* (2013.01); *C23C 16/45529* (2013.01); *C23C 16/45534* (2013.01)

(58) Field of Classification Search
None
See application file for complete search history.

(56) References Cited

U.S. PATENT DOCUMENTS

| | | | | |
|---|---|---|---|---|
| 6,270,572 | B1 * | 8/2001 | Kim ........................ | C23C 16/44 117/102 |
| 6,287,965 | B1 * | 9/2001 | Kang et al. .................. | 438/648 |
| 6,720,027 | B2 * | 4/2004 | Yang ................... | C23C 16/0272 257/E21.171 |
| 6,897,119 | B1 * | 5/2005 | Sneh ....................... | C23C 16/02 438/400 |
| 2002/0076508 | A1 * | 6/2002 | Chiang et al. ............... | 427/569 |
| 2002/0110991 | A1 * | 8/2002 | Li ..................... | C23C 16/4408 438/347 |
| 2003/0207593 | A1 * | 11/2003 | Derderian ............ | C23C 16/452 438/778 |
| 2004/0040502 | A1 * | 3/2004 | Basceri ............. | C23C 16/45514 118/715 |
| 2004/0043541 | A1 * | 3/2004 | Ahn et al. ...................... | 438/128 |
| 2005/0075510 | A1 * | 4/2005 | Meiere et al. .................... | 556/1 |
| 2005/0287775 | A1 * | 12/2005 | Hasebe et al. ................ | 438/503 |
| 2006/0244082 | A1 * | 11/2006 | Ahn et al. ...................... | 257/410 |
| 2006/0292841 | A1 * | 12/2006 | Quick .......................... | 438/584 |
| 2007/0215036 | A1 * | 9/2007 | Park et al. ....................... | 117/88 |
| 2007/0287300 | A1 * | 12/2007 | Rueger et al. ................ | 438/778 |
| 2010/0227060 | A1 * | 9/2010 | Na et al. .................. | 427/255.28 |
| 2012/0329208 | A1 * | 12/2012 | Pore et al. ..................... | 438/102 |

FOREIGN PATENT DOCUMENTS

WO    WO03063216    *  7/2003  .......... H01L 21/203

OTHER PUBLICATIONS

Sbrockey et al. "ZnO thin films by MOCVD" III-Vs Review, vol. 17, Issue 7, Sep./Oct. 2004, pp. 23-25.*
Ku, et al., "Characterization of Epitaxial Ga-Doped Zn0 Thin Films on (10-10) M-Plane Sapphire Growth by Instantaneous Doping Atomic Layer Deposition Method", R502, Symposium F4, 2011 IUMRS-ICA, Sep. 20, 2011, 22 pages.

* cited by examiner

*Primary Examiner* — Mandy Louie
(74) *Attorney, Agent, or Firm* — Muncy, Geissler, Olds & Lowe, P.C.

(57) ABSTRACT

A method for atomic layer deposition includes providing a substrate in a reaction chamber; and performing at least one atomic layer deposition cycle to form a film on a surface of the substrate. The atomic layer deposition cycle includes passing first precursors into the reaction chamber to let first atoms included in the first precursors combine with reaction sites of the substrate; and passing second precursors into the reaction chamber to let second atoms included in the second precursors combine with the reaction sites uncombined with the first atoms or substitute at least part of the first atoms to combine with the reaction sites of the substrate. The above-mentioned method for atomic layer deposition is capable of preparing large area and uniformity of doping film without annealing process or with low temperature annealing process.

15 Claims, 5 Drawing Sheets

METHOD FOR ATOMIC LAYER DEPOSITION

BACKGROUND OF THE INVENTION

1. Field of the Invention

The present invention relates to a deposition method, and more particularly to a method for atomic layer deposition.

2. Description of the Prior Art

Atomic layer deposition (ALD) is a method using self-liming reaction to deposit monolayer layer by layer on the surface of the substrate. Therefore, atomic layer deposition is able to fabricate large area thin films which are ultrathin and conformal. Doping different atoms with different features to thin films can change electronic characteristics of the films and thus broaden range of applications thereof.

Referring to transparent electrodes of ZnO-doped Gallium (ZnO:Ga) in FIG. 1 and FIG. 2, for example, the symbol Pump shown in FIG. 1 represents the time sequence for evacuating the reaction chamber. A conventional doping method of atomic layer deposition is that passing the precursor PreA with Oxygen included and the precursor PreB with Zinc included into the reaction chamber to form the ZnO layer 101 and subsequently passing the precursor PreA with Oxygen included and the precursor PreC with Gallium included into the reaction chamber to form the Gallium Oxide layer 102. Purge gas (PG) can be chosen to be passed into the reaction chamber to remove the excess precursor PreA, PreB, PreC and/or reaction byproducts. After repeating the above-mentioned process to grow sandwich structure with specific proportion of the ZnO layer 101 and the Gallium Oxide layer 102 on the surface of the substrate 10, annealing process is used for diffusing the atoms over the whole film. However, annealing process not only increases production cost and energy consuming, but it is easy to form defects, for example, vacancy, dislocation or misfit and so on; it could be seen that annealing parameters are hard to control. Additionally, annealing process with high operating temperature cannot be applied to manufacturing electrodes on organic substrates.

In summary, developing technique of atomic layer deposition to fabricate doped thin films without annealing process is a current issue.

SUMMARY OF THE INVENTION

The present invention is directed to a method for atomic layer deposition, wherein the first atom combining with the original reaction sites is substituted by the second atom which has higher chemical affinity to the reaction sites to let the second atom combine therewith, thereby preventing annealing process or otherwise using low-temperature annealing process to dope atoms needed to atomic deposition films.

According to an embodiment, the method for atomic layer deposition includes providing a substrate provided with a plurality of first reaction sites in a reaction chamber and performs an atomic layer deposition cycle to form a film including at least binary compounds on a surface of the substrate, wherein the atomic deposition cycle comprises: passing a first precursor into the reaction chamber to let a first atom included in the first precursor combine with the first reaction sites of the substrate; and passing a second precursor into the reaction chamber to let a second atom included in the second precursor substitute part of the first atoms to combine part of the first reaction sites of the substrate whereby the first reaction sites are combined with the first atom and the second atom, wherein a chemical affinity of the second atom to the first reaction sites is higher than a chemical affinity of the first atom to the first reaction sites.

The objective, technologies, features and advantages of the present invention will become more apparent from the following description in conjunction with the accompanying drawings, wherein certain embodiments of the present invention are set forth by way of illustration and examples.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings, wherein.

DESCRIPTION OF THE PREFERRED EMBODIMENT

The detail description is provided below and the preferred embodiments described are only for the purpose of description rather than for limiting the present invention.

The method for atomic layer deposition includes providing a substrate in a reaction chamber and then performing an atomic layer deposition cycle to form a film on a surface of the substrate. According to an embodiment, the film formed by the method for atomic layer deposition can be amorphous, polycrystalline or epitaxial. The atomic deposition cycle comprises: passing a first precursor into the reaction chamber to let a first atom included in the first precursor combine with first reaction sites of the substrate; and passing a second precursor into the reaction chamber to let a second atom included in the second precursor combine with the first reaction site of the substrate. According to one embodiment, the first reaction sites of the substrate are not completely occupied by the first atom, that is to say, not saturated, so that the second atom can directly combine with the first reaction sites which are not combined with the first atom. In another embodiment, whether the first reaction sites of the substrate are totally combined with the first atom, the second atom can at least substitute part of the first atom to combine with the first reaction site of the substrate. For instance, there is difference of electronegaticity between the first atom and the second atom or there is difference of binding energy between the second atom to the first reaction sites and the first atom to the first reaction sites so that the second atom can easily substitute the first atom to combine with the first reaction sites.

Figure 1:
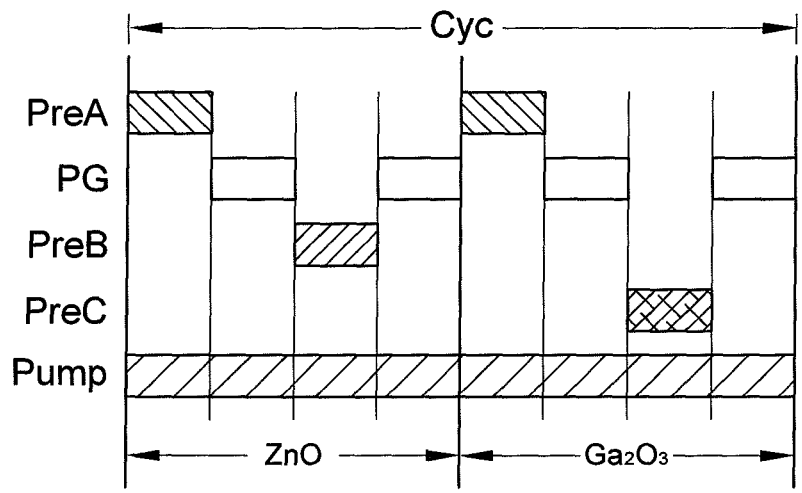
FIG. 1 is a schematic diagram illustrating the time sequence of the conventional doping method of atomic layer deposition.
Figure 2:
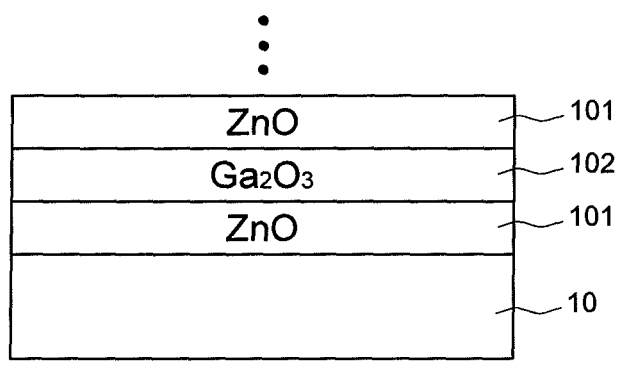
FIG. 2 is a schematic diagram illustrating the sandwich structure of the conventional doping method of atomic layer deposition.
Figure 3:
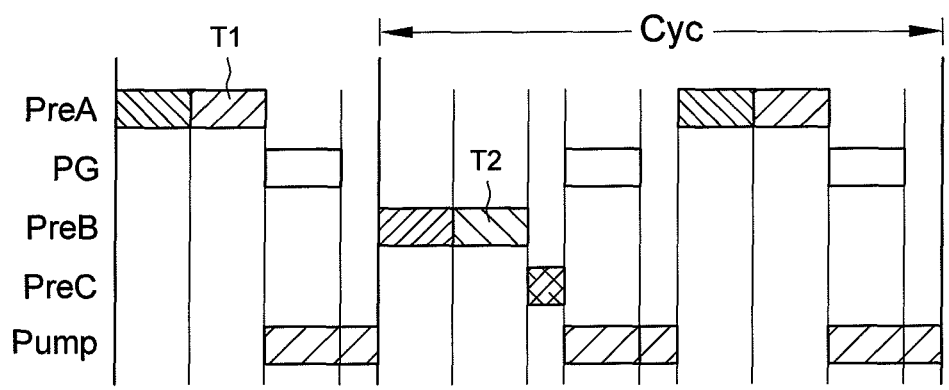
FIG. 3 is a schematic diagram illustrating the time sequence of the method for atomic layer deposition according to the first embodiment of the present invention.
Figure 4:
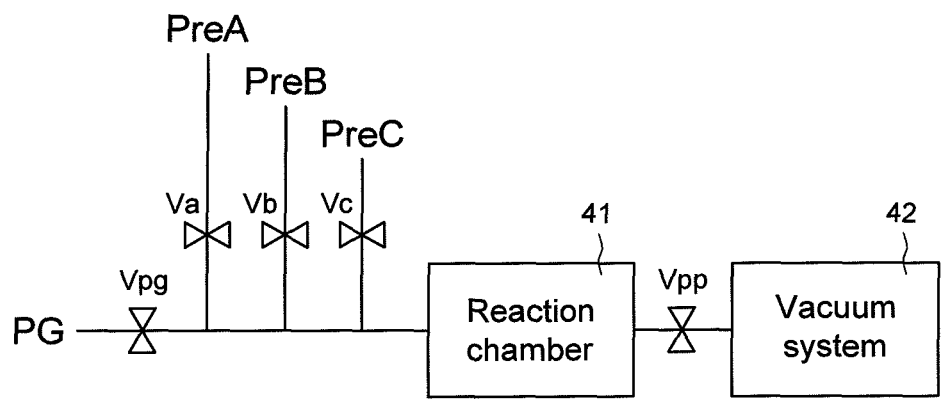
FIG. 4 is a schematic diagram illustrating the system for atomic layer deposition according to an embodiment of the present invention.

ZnO doped electrodes are considered with great potential to replace traditional ITO substrates and can be applied to display devices, light emitting diode devices, solar cell devices and so on. Referring to FIG. 3 and FIG. 4, a ZnO:Ga thin film is exemplified herein. Firstly, using the vacuum system 42 to evacuate the reaction chamber 41 to maintain the reaction chamber 41 certain degree of vacuum. After that, opening the valve Va to pass the precursor PreA with Oxygen into the reaction chamber 41 for forming an oxide layer on the substrate. For example, the precursor PreA can be water, ozone, Oxygen free radicals, peroxide, Deuterium oxide, and so on; the substrate can be a flexible or rigid and organic or inorganic substrates. The oxide layer comprises many first reaction sites for successive deposition, for example, the first reaction sites can be a hydroxyl.

According to an embodiment, before passing the precursor PreA inside, the valve Vpp between the reaction chamber 41 and the vacuum system 42 can be closed to prevent unreacted precursor PreA from being evacuated out of the reaction chamber 41 so as to save the precursor PreA. When the valve Va is switched off to stop passing the precursor PreA inside, the reaction chamber 41 can be maintained sealed for a certain period of time, as the time sequence T1 shown in the FIG. 3. The sealed reaction chamber 41 can easily achieve thermal equilibrium, which benefits growth of epitaxial structure.

Next, the reaction chamber 41 is purged, that is to say, opening the valve Vpp to evacuate the reaction chamber 41 and opening the valve Vpg to pass a purge gas PG into the reaction chamber 41 to remove the excess precursor PreA and/or byproducts in the reaction chamber 41. After stopping passing the purge gas PG inside, the reaction chamber 41 can be evacuated continuously to let the reaction chamber 41 achieve proper degree of vacuum.

After that, by closing the valve Vpp and opening the valve Vb, the precursor PreB with Zinc included is passed into the reaction chamber 41. The Zinc atom reacts with hydroxyl of the first reaction sites to combine with the surface of the substrate. Similarly, by closing the valve Vb to stop passing the precursor PreB inside, the reaction chamber 41 can be maintained sealed for a certain period of time, which benefits growth of epitaxial structure, as shown in the time sequence T2 in FIG. 3. Subsequently, by opening the valve Vc to pass the precursor PreC with Gallium included into the reaction chamber 41, the Gallium atom substitutes the Zinc atom on the ZnO layer to combine with the first reaction sites. On the other hand, controlling pulse time of passing the precursor PreC into the reaction chamber 41 can change doping concentration of Gallium, for example, the pulse time of passing the precursor PreC is less than that of passing the precursor PreB. After closing the valve Vc, the reaction chamber 41 is then purged, that is to say, opening the valve Vpp and the valve Vpg to evacuate the reaction chamber 41 and passing the purge gas PG therein.

According to an embodiment, the precursor PreA can be further passed into the reaction chamber 41 to form an Oxygen layer on the Zinc atom and the Gallium atom to be the second reaction sites wherewith the Zinc atom and the Gallium atom can combine during the next cycle. Up to now, one atomic layer deposition cycle Cyc is completed. By repeating several atomic layer deposition cycles Cyc, ZnO:Ga films can be formed with appropriate thickness on the surface of the substrate. It should be understood that the process of passing the precursor PreA, PreB and PreC inside can be repeated within each atomic layer deposition cycle Cyc for forming different layers of doped films. It should be noticed choosing appropriate precursors according to different requirements can form doped films with binary compounds.

Because the Gallium atom substitutes the Zinc atom to combine with the surface of the substrate, defects such as vacancy, dislocation and misfit of epitaxial films formed via the method for atomic layer deposition according to the present invention can be reduced to improve electronic properties of thin films.

Referring to Table 1, it records comparative data of room temperature Hall measurement between Gallium undoped ZnO and Gallium doped ZnO. It can be seen from the data in Table 1 that the free electron concentration of the Gallium doped ZnO according to the method of the present invention rises to $1.29 \times 10^{21}$ by two orders of magnitude with slight increase of electron mobility and resistivity thereof is well-matched to that of traditional ITO electrodes.

TABLE 1 the comparative data between specimens of Gallium undoped ZnO and Gallium doped ZnO.

| Specimen | Resistivity (ohm-cm) | Free Electron concentration ($cm^{-3}$) | Electron Mobility ($cm^2 V^{-1} S^{-1}$) |
|---|---|---|---|
| Ga undoped ZnO | $1.48 \times 10^{-4}$ | $5.94 \times 10^{19}$ | 7.07 |
| Ga doped ZnO | $5.56 \times 10^{-4}$ | $1.29 \times 10^{21}$ | 8.65 |

In foregoing embodiments, the first precursor is the precursor PreB, the second precursor is the precursor PreC and the third precursor is the precursor PreA. It should be understood that if there are the proper reaction site on the surface of the substrate, the step of the first time passing the precursor PreA inside can be omitted. Moreover, the precursor forming an atomic layer on the surface of the substrate for providing the first reaction sites can be different from the third precursor. Besides, the process or parameters on whether to purge the reaction chamber 41 or whether to evacuate the reaction chamber 41 after passing the next precursor inside can be adjusted according to different requirements. For example, the reaction chamber 41 can be purged before passing the precursor PreC therein or the reaction chamber 41 can be evacuated continuously while performing atomic layer deposition.

Figure 5:
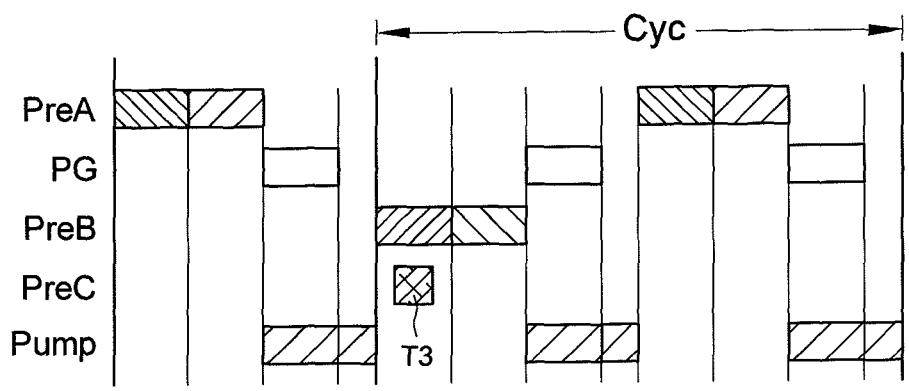
FIG. 5 is a schematic diagram illustrating the time sequence of the method for atomic layer deposition according to the second embodiment of the present invention.
Figure 6:
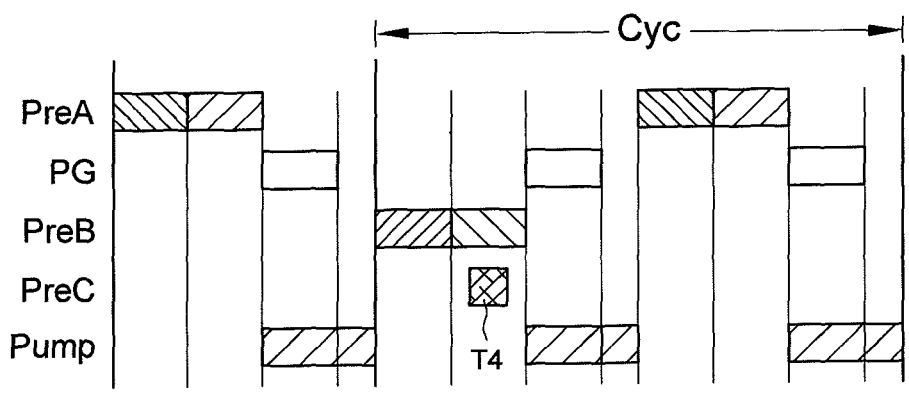
FIG. 6 is a schematic diagram illustrating the time sequence of the method for atomic layer deposition according to the third embodiment of the present invention.
Figure 7:
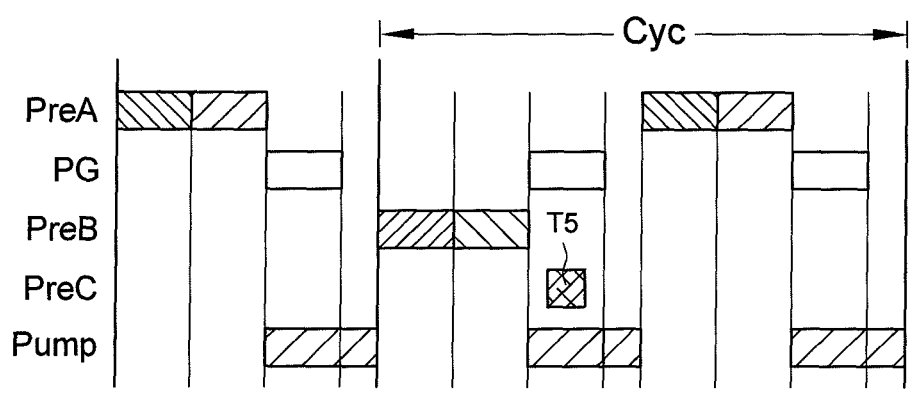
FIG. 7 is a schematic diagram illustrating the time sequence of the method for atomic layer deposition according to the fourth embodiment of the present invention.

In one embodiment, when passing the precursor PreB with the substituted atom into the reaction chamber 41, the precursor PreC with the substituting atom can be passed inside simultaneously, as the time sequence T3 shown in FIG. 5. According to one embodiment, when passing the precursor PreB with the substituted atom included and sealing the reaction chamber 41, the precursor PreC with the substituting atom included can be passed inside simultaneously, as the time sequence T4 shown in FIG. 6. In one embodiment, the precursor PreC can be passed inside while purging the reaction chamber 41. For example, the precursor PreC can be passed into the reaction chamber 41 with a purge gas PG (as the time sequence T5 shown in FIG. 7) or be passed inside while evacuating the reaction chamber 41. In brief, a delay time between the initial time of passing the precursor with substituting atoms inside and the initial time of passing the precursor with substituted atoms inside can range from 0 to 1000000 seconds.

Figure 8:
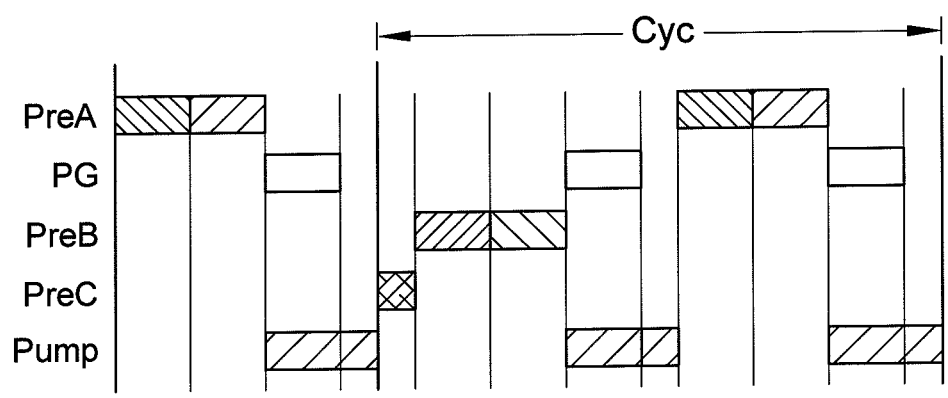
FIG. 8 is a schematic diagram illustrating the time sequence of the method for atomic layer deposition according to the fifth embodiment of the present invention.

Referring to FIG. 8 according to another embodiment, the precursor PreB comprises the substituting atom and the precursor PreC comprises the substituted atom; the substituted atom is also used as the doping atom. As shown in FIG. 8, a layer with saturated or subsaturated atoms can be formed on the surface of the substrate and then passing the precursor PreB with the substituting atom inside to partly substitute the doping atom on the doped atomic layer. Concentration of the doping atom on the surface of the substrate can be adjusted by adjusting the pulse time of passing the precursor PreB. According to embodiments shown in FIG. 3 and FIG. 8, doping atoms can be substituting atoms or substituted atoms. For example, Nitrogen and Phosphorus atom can substitute Oxygen atom; Nitrogen, Magnesium, Gallium, Aluminum, Manganese, Cadmium, Iron, Cobalt and so on can substitute Zinc atom; Silicon, Indium, Magnesium and so on can substitute Gallium.

According to the method for atomic layer deposition mentioned above, a doped film can be formed without annealing process. Thus, the method for atomic layer deposition of the present invention can be applied to form a doped film on substrates with low heat resistance temperature (e.g. organic substrates), but not limited to this. The method for atomic layer deposition of the present invention also can comprise an annealing step, wherein the annealing temperature is lower than a heat resistance temperature of substrates to prevent substrates from thermal deformation.

In one embodiment, reaction temperature of the precursor including the substituting atom and the substituted atom range from −25 degrees Celsius to 1500 degrees Celsius. Similarly, choosing the reaction temperature depends on the heat resistance temperature of the substrate, that is to say, reaction temperature of the precursor should be lower than the heat resistance temperature of the substrate.

In summary, the method for atomic layer deposition of the present invention uses the second atom which has higher chemical affinity to the reaction sites to substitute the first atom originally combining with the reaction sites and combine with part of the reaction sites, whereby annealing process can be omitted or using low temperature annealing while doping atoms needed for the deposition film. Therefore, the method for atomic layer deposition of the present invention can be applied to flexible organic substrates. Besides, according to the method for atomic layer deposition of the present invention, a doped film including binary compounds or multiple compounds from −6 valence to +6 valence can be fabricated by designing proper deposition process, and composition of doping atoms can be adjusted by controlling the temperature of the storage tank of the precursor, passing time of the precursor, and pressure and growth temperature of the substrate.

While the invention is susceptible to various modifications and alternative forms, a specific example thereof has been shown in the drawings and is herein described in detail. It should be understood, however, that the invention is not to be limited to the particular form disclosed, but to the contrary, the invention is to cover all modifications, equivalents, and alternatives falling within the spirit and scope of the appended claims.

What is claimed is:

1. A method for atomic layer deposition comprising:
providing a substrate in a reaction chamber; and
performing an atomic layer deposition cycle to form an epitaxial film on a surface of the substrate, wherein the atomic layer deposition cycle comprises:
passing a first precursor into the reaction chamber to let a first atom included in the first precursor combine with first reaction sites of the substrate; and
passing a second precursor into the reaction chamber to let a second atom included in the second precursor substitute part of the first atoms to combine with part of the first reaction sites of the substrate whereby part of the first reaction sites are combined with the first atom and the other of the first reaction sites are combined with the second atom, wherein a chemical affinity of the second atom to the first reaction sites is higher than a chemical affinity of the first atom to the first reaction sites, and the reaction chamber is sealed for a certain period of time after passing the first precursor or the second precursor therein.

2. The method for atomic layer deposition according to claim 1, wherein the atomic layer deposition cycle further comprises:
passing a third precursor into the reaction chamber to let third atoms included in the third precursor combine with the first atom and the second atom.

3. The method for atomic layer deposition according to claim 2, wherein the third atoms provides second reaction sites for the first atom and the second atom to combine with during a next atomic deposition cycle.

4. The method for atomic layer deposition according to claim 1, wherein the step of passing the first precursor or the second precursor into the reaction chamber during the each atomic deposition cycle is repeated.

5. The method for atomic layer deposition according claim 1 further comprising:
passing a fourth precursor into the reaction chamber to let fourth atoms included in the fourth precursor combine with the surface of the substrate to provide the first reaction sites.

6. The method for atomic layer deposition according to claim 1, wherein the atomic deposition cycle further comprises:
passing a purge gas into the reaction chamber to remove excess of at least one of the first precursor, the second precursor and a reaction byproduct.

7. The method for atomic layer deposition according to claim 6, wherein the reaction chamber is evacuated while passing the purge gas therein and stop evacuating the reaction chamber before passing the first precursor or the second precursor therein.

8. The method for atomic layer deposition according to claim 1, wherein the pulse time of passing the second precursor into the reaction chamber is less than that of passing the first precursor into the reaction chamber.

9. The method for atomic layer deposition according to claim 1, wherein the second precursor is passed with a purge gas into the reaction chamber.

10. The method for atomic layer deposition according to claim 1, wherein the second precursor is passed into the reaction chamber during the certain period of time.

11. The method for atomic layer deposition according to claim 1, wherein delay time between an initial time of passing the first precursor into the reaction chamber and an initial time of passing the second precursor therein ranges from 0 to 1000000 seconds.

12. The method for atomic layer deposition according to claim 1, wherein the substrate comprises an organic substrate or an inorganic substrate.

13. The method for atomic layer deposition according to claim 1, wherein the reaction temperature of the first precursor and the second precursor range from −25 degrees Celsius to 1500 degrees Celsius.

14. The method for atomic layer deposition according to claim 1 further comprising:
   performing an annealing process, wherein the annealing temperature is lower than a heat resistance temperature of the substrate.

15. The method for atomic layer deposition according to claim 1, wherein an oxide layer comprises the first reaction sites.

* * * * *